(12) United States Patent
Jiang et al.

(10) Patent No.: US 9,964,823 B2
(45) Date of Patent: May 8, 2018

(54) DISPLAY PANEL AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Peng Jiang, Beijing (CN); Weihua Jia, Beijing (CN); Haipeng Yang, Beijing (CN); Jaikwang Kim, Beijing (CN); Yongjun Yoon, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days. days.

(21) Appl. No.: 15/511,057

(22) PCT Filed: Apr. 14, 2016

(86) PCT No.: PCT/CN2016/079266
§ 371 (c)(1),
(2) Date: Mar. 14, 2017

(87) PCT Pub. No.: WO2016/206449
PCT Pub. Date: Dec. 29, 2016

(65) Prior Publication Data
US 2017/0277008 A1    Sep. 28, 2017

(30) Foreign Application Priority Data

Jun. 23, 2015  (CN) .......................... 2015 1 0351009

(51) Int. Cl.
*H01L 27/14*   (2006.01)
*G02F 1/1362*  (2006.01)
(Continued)

(52) U.S. Cl.
CPC ...... *G02F 1/136286* (2013.01); *G02F 1/1368* (2013.01); *G02F 1/13439* (2013.01);
(Continued)

(58) Field of Classification Search
CPC ......... G02F 1/136286; G02F 1/133345; G02F 1/133512; G02F 1/133514; G02F 1/134309; G02F 1/13439; G02F 1/1368
(Continued)

(56) References Cited

U.S. PATENT DOCUMENTS 5,930,591 A * 7/1999  Huang .............. H01L 27/14658
                                              257/E27.14
9,323,111 B2   4/2016  Um et al.
(Continued)

FOREIGN PATENT DOCUMENTS

CN         102109718 A      6/2011
CN         102998859 A      3/2013
(Continued)

OTHER PUBLICATIONS

First Office Action from Chinese Patent Application No. 201510351009.1, dated Jul. 5, 2017, 11 pages.
(Continued)

*Primary Examiner* — Brook Kebede
(74) *Attorney, Agent, or Firm* — Westman, Champlin & Koehler, P.A.

(57) ABSTRACT

A display panel includes an array substrate having a plurality of pixel regions in multi-rows and multi-columns, a thin film transistor comprising a gate, a source, a drain and an active layer being provided in each of the pixel regions. Two gate lines are provided between two adjacent rows of pixel regions. Two adjacent columns of pixel regions constitute one pixel column group, and a data line is provided between two columns of pixel regions in the same one pixel column
(Continued)

group. The array substrate further includes a pixel electrode, a common electrode and a common electrode line comprising a horizontal common electrode line parallel to the gate line, wherein a projection of the horizontal common electrode line in a direction perpendicular to the display panel is not overlapped with projections of the drains of respective thin film transistors in the direction perpendicular to the display panel.

12 Claims, 4 Drawing Sheets

(51) Int. Cl.
  *G02F 1/1368* (2006.01)
  *G02F 1/1343* (2006.01)
  *G02F 1/1333* (2006.01)
  *G02F 1/1335* (2006.01)
  *H01L 27/12* (2006.01)

(52) U.S. Cl.
  CPC .. *G02F 1/133345* (2013.01); *G02F 1/133512* (2013.01); *G02F 1/133514* (2013.01); *G02F 1/134309* (2013.01); *G02F 2201/121* (2013.01); *G02F 2201/123* (2013.01); *H01L 27/124* (2013.01)

(58) Field of Classification Search
  USPC ......... 257/72; 345/55, 92, 208, 209; 438/36, 438/160, 166
  See application file for complete search history.

(56) References Cited

U.S. PATENT DOCUMENTS

| 9,323,122 B2 | 4/2016 | Jiang et al. |
| 2003/0038917 A1 | 2/2003 | Song et al. |
| 2012/0086687 A1* | 4/2012 | Tsubata ................ G09G 3/3659 345/209 |

FOREIGN PATENT DOCUMENTS

| CN | 202837763 U | 3/2013 |
| CN | 103116238 A | 5/2013 |
| CN | 104570530 A | 4/2015 |
| CN | 104880871 A | 9/2015 |

OTHER PUBLICATIONS

International Search Report (English translation) and Written Opinion of International Application No. PCT/CN2016/079266, dated Jun. 28, 2016, 8 pages.
English translation of Box No. V of the Written Opinion for the International Searching Authority for International Application No. PCT/CN2016/079266, 2 pages.

* cited by examiner

DISPLAY PANEL AND DISPLAY DEVICE

CROSS-REFERENCE TO RELATED APPLICATION

This application is a Section 371 National Stage Application of International Application No. PCT/CN2016/079266, filed on Apr. 14, 2016, entitled "DISPLAY PANEL AND DISPLAY DEVICE", which claims priority to Chinese Application No. 201510351009.1, filed on Jun. 23, 2015, incorporated herein by reference in their entirety.

BACKGROUND OF THE DISCLOSURE

Field of the Disclosure

The present disclosure relates to a field of display technology, in particular, to a display panel and a display device.

Description of the Related Art

In a flat display device, it is common for twisted nematic (TN) or vertical alignment (VA) liquid crystal display (LCD) device to reduce a quantity of chips on flex or chips on film (COF) in order to reduce cost. Moreover, a width of a frame of the LCD device is gradually decreased. As a result, a design of dual gate lines has been developed so as to reduce by half the data COFs.

With the development of display technology, an advanced super dimension switch (AD-SDS, also abbreviated as ADS) LCD device is developed. The ADS-LCD device has a good display quality with high resolution, high transmittance, low power consumption, wide viewing angle, high aperture ratio, low chromatic aberration, no push mura and so on. However, there have been no technical schemes for applying dual-gate lines to the ADS-LCD device so far, thus there is a room for improvement in the performance and cost of the ADS-LCD device.

SUMMARY

In order to solve the above defects, the present disclosure provides a display panel and a display device.

According to an aspect of the present disclosure, it is provided a display panel comprising an array substrate having a plurality of pixel regions in multi-rows and multi-columns, a thin film transistor comprising a gate, a source, a drain and an active layer being provided in each of the pixel regions. Two gate lines are provided between two adjacent rows of pixel regions, and the gates of the thin film transistors in two adjacent pixel regions in the same one row of pixel regions are respectively connected to two gate lines adjacent to the row of pixel regions. Two adjacent columns of pixel regions constitute one pixel column group, a data line is provided between two columns of pixel regions in the same one pixel column group, and no data line is provided between any two pixel column groups. The sources of the thin film transistors in the pixel regions in the same one pixel column group are connected to the date line provided within the pixel column group. The array substrate further comprises a pixel electrode, a common electrode and a common electrode line comprising a horizontal common electrode line parallel to the gate line, wherein a projection of the horizontal common electrode line in a direction perpendicular to the display panel is not overlapped with projections of the drains of respective thin film transistors in the direction perpendicular to the display panel.

According to an embodiment of the present disclosure, the horizontal common electrode line may comprise horizontal common electrode line main parts parallel to the gate line and horizontal common electrode line connecting parts surrounding the drains of the respective thin film transistors. A gap is formed between the horizontal common electrode line connecting part and the drain of the thin film transistor in a corresponding pixel region.

According to an embodiment of the present disclosure, a part of the horizontal common electrode line connecting part surrounding the drain of the thin film transistor may have a shape of right angle, a shape of oblique angle or an arc shape.

According to an embodiment of the present disclosure, the common electrode line may further comprise vertical common electrode lines disposed between each two pixel column groups.

According to an embodiment of the present disclosure, an insulating layer may be provided between the pixel electrode and the common electrode line connected to the common electrode, and the vertical common electrode lines may be electrically connected to each other through respective connecting electrodes disposed on the same layer as the pixel electrode and respective connecting via holes extending through the insulating layer.

According to an embodiment of the present disclosure, the common electrode lines, the gates of respective thin film transistors and the gate lines may be disposed on the same layer.

According to an embodiment of the present disclosure, the common electrode and the pixel electrode may both be disposed within the pixel region, the common electrode line may be connected to the common electrode, and the pixel electrode may be connected to the drain of the thin film transistor in a corresponding pixel region. The common electrode may be a plate-like electrode, the pixel electrode may be a slit-like electrode, and a projection of the pixel electrode in the direction perpendicular to the display panel may be overlapped with a projection of the common electrode in the direction perpendicular to the display panel.

According to an embodiment of the present disclosure, each of the thin film transistors may be a bottom gate thin film transistor, and the common electrode may be disposed below the common electrode line.

According to an embodiment of the present disclosure, the display panel may further comprise a color film substrate comprising a black matrix. A projection of the common electrode line in the direction perpendicular to the display panel may be overlapped with a projection of the black matrix in the direction perpendicular to the display panel.

According to an embodiment of the present disclosure, the gap between the horizontal common electrode line connecting part and the drain of the thin film transistor in the corresponding pixel region may range from 1.5 μm to 4 μm.

According to another aspect of the present disclosure, it is provided a display device comprising the display panel according to the present disclosure.

BRIEF DESCRIPTION OF THE DRAWINGS

In order to more clearly explain technical solutions of embodiments of the present disclosure, the embodiments of the present disclosure will be described in detail below with reference to the accompanying drawings. It is to be understood that the following description is only for the purpose of explaining the embodiments of the disclosure and is not intended to limit the scope of the present disclosure. Various modifications and changes may be made to the embodiments by those skilled in the art without departing from the scope of the present disclosure. In the drawings.

DETAILED DESCRIPTION OF PREFERRED EMBODIMENTS OF THE DISCLOSURE

The display panel and the display device according to the present disclosure will be described in further detail below with reference to the accompanying drawings and specific embodiments in order to provide a better understanding of the technical solutions of the present disclosure for those skilled in the art.

With a technical concept of the present disclosure, horizontal common electrode lines extending in a row direction of pixel regions are provided, and a projection of the horizontal common electrode line is not overlapped with projections of drains of thin film transistors in respective pixel regions in a direction perpendicular to the display panel, so that a design of dual gate lines may be realized in an ADS display panel. Since the projection of the horizontal common electrode line is not overlapped with the projections of the drains of the respective thin film transistors in the direction perpendicular to the display panel, an electrostatic discharge (ESD) due to a formation process of a gate insulating layer may be avoided. Moreover, it is possible to increase a uniformity of voltages of common electrodes in the display panel, to reduce resistances of the common electrode lines, and to reduce a voltage difference between a pixel electrode and the common electrode.

Figure 1:
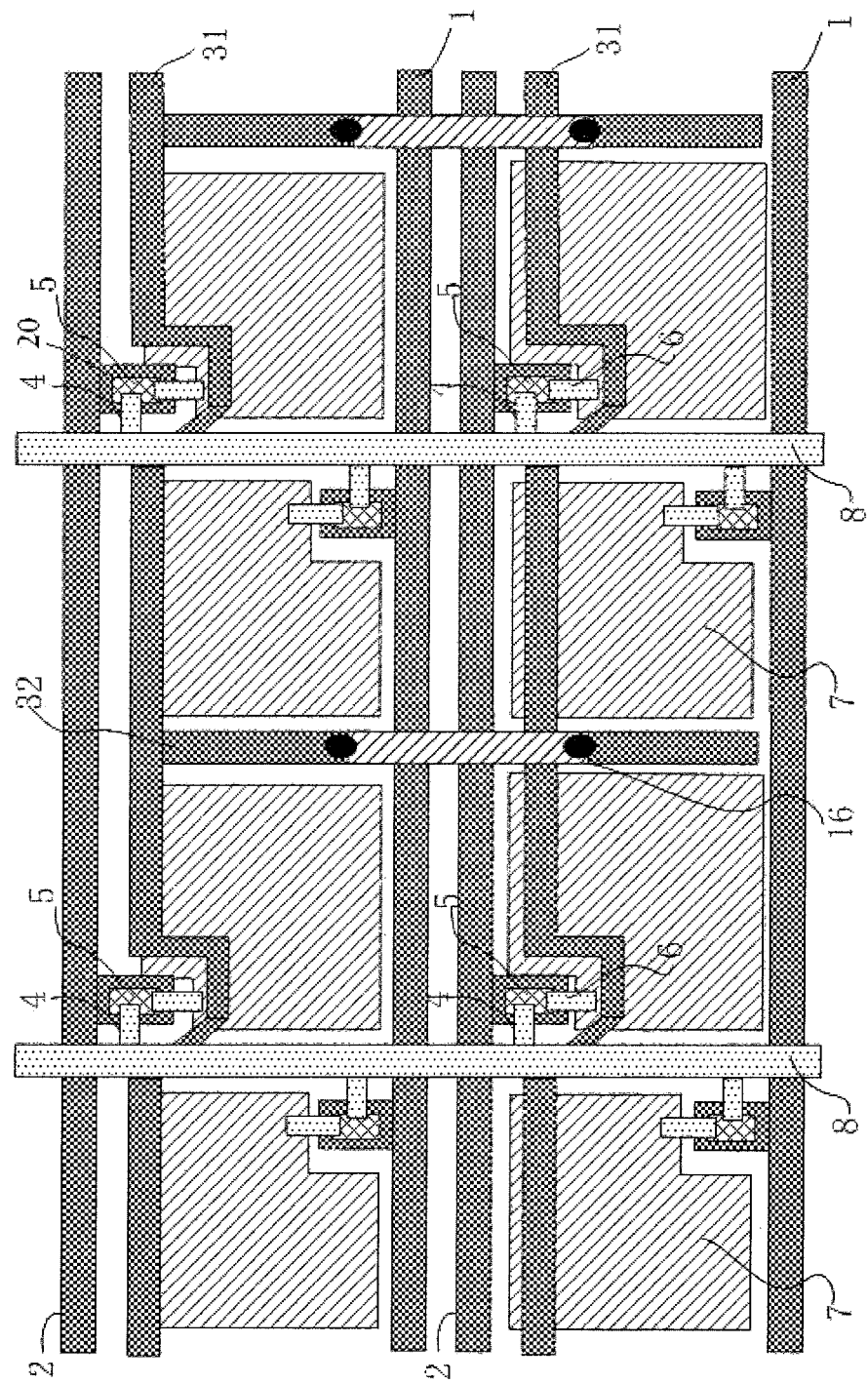
FIG. 1 is a top view of a display panel according to an embodiment of the present disclosure.
Figure 2:
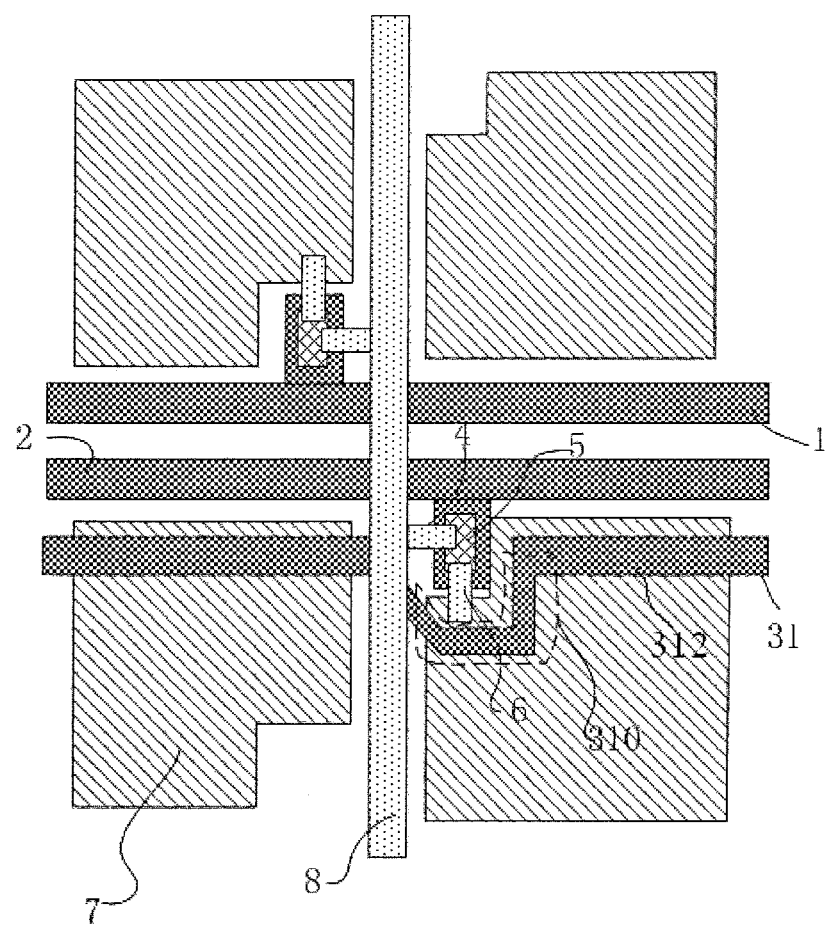
FIG. 2 is a schematic partial view of the display panel in FIG. 1.
Figure 3:
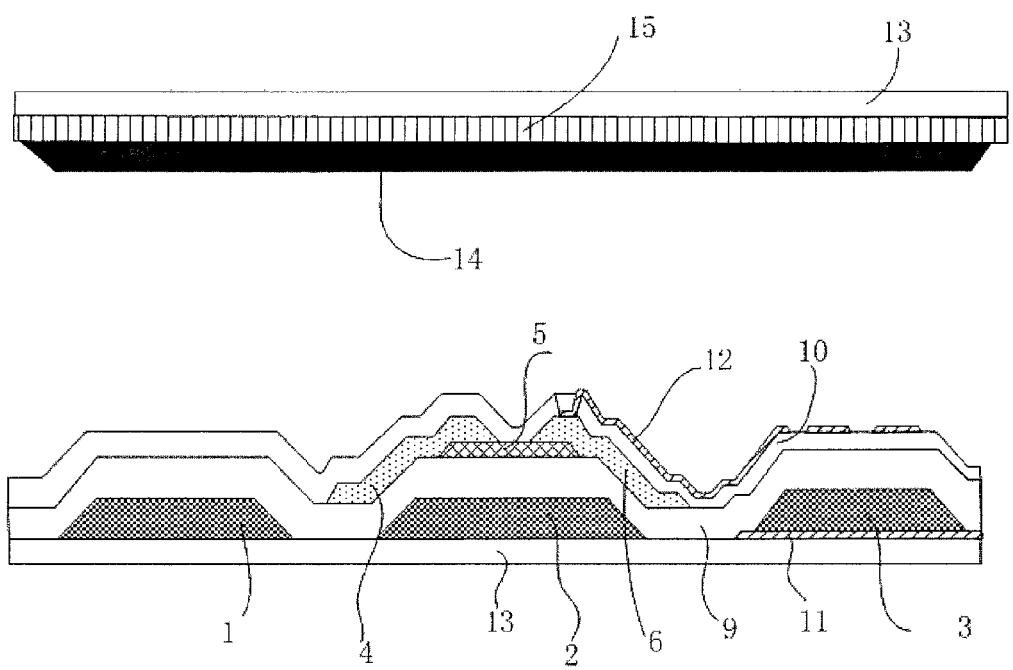
FIG. 3 is a cross section view of the display panel according to the embodiment of the present disclosure.

FIG. 1 is a top view of a display panel according to an embodiment of the present disclosure, FIG. 2 is a schematic partial view of the display panel in FIG. 1, and FIG. 3 is a cross section view of the display panel according to the embodiment of the present disclosure.

Referring to FIGS. 1-3, the display panel according to the embodiment of the present disclosure may comprise an array substrate and a color filter substrate. As shown in FIG. 1, the array substrate may be divided into a plurality of pixel regions 7 in multi-rows and multi-columns. In each pixel region 7, a thin film transistor comprising a gate 20, a source 4, an active layer 5 and a drain 6 may be provided. In the display panel as shown in FIG. 1, the gate of the thin film transistor may form a part of a first gate line 1 or a second gate line 2 extending into the corresponding pixel region 7, and a projection of the extending part is partially or entirely overlapped with projections of the active layer 5, the source 4 and the drain 6 of the thin film transistor in a direction perpendicular to the display panel.

Referring to FIG. 1, two gate lines, including the first gate line 1 and the second gate line 2, are provided between two adjacent rows of pixel regions. Moreover, the gates of the thin film transistors in two adjacent pixel regions in the same one row of pixel regions are connected to two gate lines adjacent to the row of pixel regions, respectively. For example, as shown in FIG. 1, the gate of the thin film transistor in the first pixel region (e.g., the leftmost pixel region) in the first row (e.g., an upper row) of pixel regions is connected to a lower gate line 1 adjacent to the first row of pixel regions, and the gate of the thin film transistor in the second pixel region (e.g., the second pixel region from the left side) in the first row of pixel regions is connected to an upper gate line 2 adjacent to the first row of pixel regions. However, the present disclosure is not limited thereto. Optionally, the gate of the thin film transistor in the first pixel region in a row of pixel regions may be connected to an upper gate line 2 adjacent to the row of pixel regions, and the gate of the thin film transistor in the second pixel region in the row of pixel regions may be connected to a lower gate line 1 adjacent to the first row of pixel regions. In other words, the gates of the thin film transistors in the same one row of pixel regions are alternately connected to the lower gate line adjacent to the row of pixel regions and the upper gate line adjacent to the row of pixel regions.

Referring to FIG. 1, two adjacent columns of pixel regions may constitute one pixel column group. For example, as shown in FIG. 1, the first column of pixel regions (e.g., leftmost column of pixel regions) and the second column of pixel regions (e.g., the second column of pixel regions from the left side) may constitute a first pixel column group, and the third column of pixel regions and the fourth column of pixel regions may constitute a second pixel column group. A data line 8 is provided between two columns of pixel regions of the same one pixel column group, and no data line is provided between any two pixel column groups. The sources 4 of the thin film transistors in the pixel regions of the same one pixel column group are connected to the data line 8 provided within the pixel column group. Moreover, as shown in FIG. 3, the array substrate according to the embodiment may further comprise a pixel electrode 12, a common electrode 11 and a common electrode line 3. The common electrode line 3 may comprise a horizontal common electrode line 31 parallel to the gate lines 1, 2 and a vertical common electrode line 32 provided between any two pixel column groups, as shown in FIG. 1. The projections of horizontal common electrode lines 31 are not overlapped with the projection of the drains 6 of the thin film transistors in respective pixel regions in a direction perpendicular to the display panel. However, the present disclosure is not limited thereto. Optionally, no vertical common electrode line 32 may be provided.

With the above structure, an ADS array substrate with dual gate lines is provided. Two adjacent pixels in the same one row are controlled by one data line and two respective gate lines. Since a driving IC of the data line is more expensive than a driving IC of the gate line, the display panel with such a structure may have similar advantages to the ADS display panel. Further, the data COFs may be reduced by half by means of dual gate lines, thereby reducing product cost effectively.

Referring to FIG. 2, according to the embodiment, the horizontal common electrode line 31 may comprise horizontal common electrode line main parts 312 parallel to the gate line and horizontal common electrode line connecting parts 310 surrounding the drains 6 of the respective thin film transistors. A gap may be formed between the horizontal common electrode line connecting part 310 and the drain 6 of the thin film transistor in corresponding pixel region 7.

As shown in FIG. 2, a part of the horizontal common electrode line connecting part 310 surrounding the drain 6 of the thin film transistor may have a shape of right angle.

Figure 4:
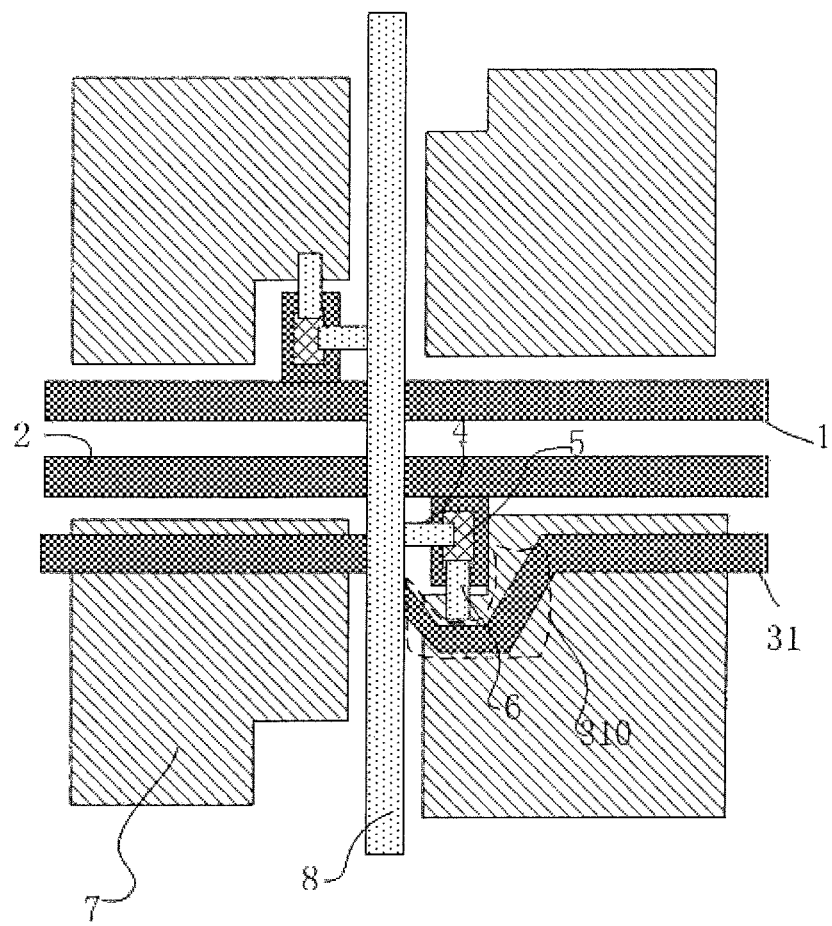
FIG. 4 is a schematic partial view of a display panel according to another embodiment of the present disclosure.

FIG. 4 is a schematic partial view of a display panel according to another embodiment of the present disclosure. As shown in FIG. 4, the part of the horizontal common electrode line connecting part 310 surrounding the drain 6 of the thin film transistor may have a shape of oblique angle.

However, the present disclosure is not limited thereto. Optionally, the part of the horizontal common electrode line connecting part 310 surrounding the drain 6 of the thin film transistor may have other shapes, for example, an arc shape.

Typically, a lower limit of a width of the gap between the horizontal common electrode line connecting part 310 and the drain 6 should satisfy an alignment accuracy requirement for a preparing process of the array substrate, and an upper limit thereof should be as large as possible without affecting an aperture ratio adversely. According to an embodiment of the present disclosure, the width of the gap between the horizontal common electrode line connecting part 310 and the drain 6 ranges from 1.5 µm to 4 µm.

According to an embodiment of the present disclosure, the horizontal common electrode line 31 bypasses the drains 6 of respective thin film transistors in its extending direction, such that the projection of the horizontal common electrode line 31 is not overlapped with the projections of the drains of the respective thin film transistors in the direction perpendicular to the display panel. Since a welding pad for the drain is small, a pixel aperture ratio will be less affected. With the horizontal common electrode line arranged in this way, a resistance of the common electrode line may be reduced without affecting the aperture ratio, so that a defect of greenish image presented in certain screens due to a big resistance of the common electrode line or a big coupling capacitance may be avoided. Since the horizontal common electrode line 31 does not extend through below the drains 6 of respective thin film transistors, a short circuit between a data line signal and a common electrode signal caused by a voltage difference between the common electrode 3 and the drain 6 may be avoided.

According to an embodiment of the present disclosure, the thin film transistor may be a bottom gate thin film transistor, and the common electrode 11 may be disposed below the common electrode line 3, as shown in FIG. 3. In the embodiment illustrated in FIG. 3, the common electrode 11 is disposed on a substrate 13, and the common electrode line 3 is disposed on the common electrode 11. The gate lines 1 and 2 may be disposed on the same layer as the common electrode line 3. A gate insulating layer 9, an active layer 5, a source 4, a drain 6, a passivation layer 10 and a pixel electrode 12 are formed in that order on the substrate 13 on which the gate lines 1, 2 and common electrode line 3 have been formed. The color filter substrate may comprise a color filter layer 15 and a black matrix 14 formed on a substrate 13 in order.

The common electrode 11 and the pixel electrode 12 both are disposed within the pixel region 7. The common electrode line 3 is connected to the common electrode 11, and the pixel electrode 12 is connected to the drain 6 of the thin film transistor in the corresponding pixel region 7. In the embodiment illustrated in FIG. 3, the common electrode may be a plate-like electrode and the pixel electrode may be a slit-like electrode, and a projection of the pixel electrode 12 and a projection of the common electrode 11 are overlapped with each other in the direction perpendicular to the display panel. However, the present disclosure is not limited thereto, as long as one of the common electrode and the pixel electrode is a slit-like electrode and the other one is a plate-like electrode, in addition, as long as the slit-like electrode is positioned on an upper position (that is, more close to the color filter substrate).

Referring to FIG. 1 again, in a case that the common electrode line 3 further comprises a vertical common electrode line 32, the vertical common electrode lines 32 disposed between two any pixel column groups are disconnected with each other in the vertical direction so as to avoid intersecting with the gate lines 1 and 2 in the same layer.

Figure 5:
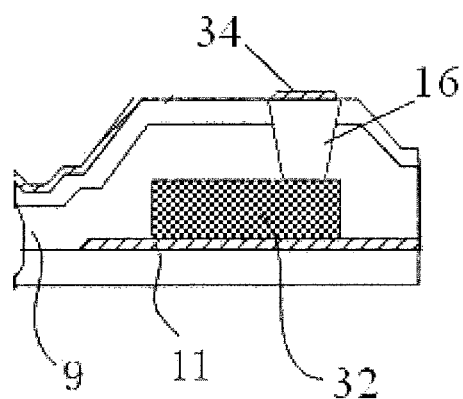
FIG. 5 is a partial cross section view of the display panel according to the embodiment of the present disclosure.

According to an embodiment of the present disclosure, the insulating layer 9 may be disposed between the pixel electrode 12 and the common electrode line 3 connected to the common electrode 11, as shown in FIG. 3. The vertical common electrode lines 32 may be electrically connected to each other through respective connecting electrodes 34 disposed on the same layer as the pixel electrode 12 and respective connecting via holes 16 extending through the insulating layer 9, as shown in FIG. 5. Herein, the horizontal common electrode lines 31, the vertical common electrode lines 32 and the connecting electrodes 34 for connecting the vertical common electrode lines 32 may constitute a grid of common electrode line 3, so that the resistance of the common electrode line 3 may be reduced and the uniformity of the common electrode voltages may be improved.

According to an embodiment of the present disclosure, a projection of the common electrode line 3 of the array substrate may be overlapped with a projection of the black matrix 14 of the color filter substrate in the direction perpendicular to the display panel.

With the display panel according to the present disclosure, it is possible to increase a uniformity of voltages of common electrodes in the display panel, to reduce resistances of the common electrode lines, and to reduce a voltage difference between the pixel electrode and the common electrode. Further, an electro-static discharge (ESD) due to a formation process of a gate insulating layer may be avoided. Therefore, the display device comprising the display panel may obtain a good display quality and a low cost.

According to another aspect of the present disclosure, it is provided a display device comprising the display panel according to the present disclosure. The display device may comprise, but not limited to, any products or components having display function, such as liquid crystal panel, e-paper, mobile phone, panel computer, television, display, laptop computer, digital frame, navigator and so on.

It is to be understood that the above embodiments are merely exemplary implementations for explaining principles of the present disclosure, however, the present disclosure is not limited to the above embodiments. It is apparent to those skilled in the art to make various modifications and changes thereto without departing the spirit and scope of the present disclosure, and these modifications and changes should fall into the scope of the present disclosure.

What is claimed is:

1. A display panel comprising an array substrate having a plurality of pixel regions in multi-rows and multi-columns, a thin film transistor comprising a gate, a source, a drain and an active layer being provided in each of the pixel regions,
   wherein, two gate lines are provided between two adjacent rows of pixel regions, and the gates of the thin film transistors in two adjacent pixel regions in the same one row of pixel regions are respectively connected to two gate lines adjacent to the row of pixel regions, and
   wherein, two adjacent columns of pixel regions constitute one pixel column group, a data line is provided between two columns of pixel regions in the same one pixel column group, and no data line is provided between any two pixel column groups, and the sources of the thin film transistors in the pixel regions in the same one pixel column group are connected to the data line provided within the pixel column group, and
   wherein, the array substrate further comprises a pixel electrode, a common electrode and a common electrode line comprising a horizontal common electrode line parallel to the gate line, wherein a projection of the horizontal common electrode line in a direction perpendicular to the display panel is not overlapped with projections of the drains of respective thin film transistors in the direction perpendicular to the display panel.

2. The display panel according to claim 1, wherein the horizontal common electrode line comprises horizontal common electrode line main parts parallel to the gate line and horizontal common electrode line connecting parts surrounding the drains of the respective thin film transistors, and a gap is formed between the horizontal common electrode line connecting part and the drain of the thin film transistor in a corresponding pixel region.

3. The display panel according to claim 2, wherein a part of the horizontal common electrode line connecting part surrounding the drain of the thin film transistor has a shape of right angle, a shape of oblique angle or an arc shape.

4. The display panel according to claim 2, wherein the gap between the horizontal common electrode line connecting part and the drain of the thin film transistor in the corresponding pixel region ranges from 1.5 μm to 4 μm.

5. The display panel according to claim 1, wherein the common electrode line further comprises vertical common electrode lines disposed between each two pixel column groups.

6. The display panel according to claim 5, wherein an insulating layer is provided between the pixel electrode and the common electrode line connected to the common electrode, and the vertical common electrode lines are electrically connected to each other through respective connecting electrodes disposed on the same layer as the pixel electrode and respective connecting via holes extending through the insulating layer.

7. The display panel according to claim 1, wherein the common electrode lines, the gates of respective thin film transistors and the gate lines are disposed in the same layer.

8. The display panel according to claim 1, wherein the common electrode and the pixel electrode both are disposed within the pixel region, the common electrode line is connected to the common electrode, and the pixel electrode is connected to the drain of the thin film transistor in a corresponding pixel region, and
wherein, the common electrode is a plate-like electrode, the pixel electrode is a slit-like electrode, and a projection of the pixel electrode in the direction perpendicular to the display panel is overlapped with a projection of the common electrode in the direction perpendicular to the display panel.

9. The display panel according to claim 1, wherein, each of the thin film transistors is a bottom gate thin film transistor, and the common electrode is disposed below the common electrode line.

10. The display panel according to claim 1, further comprising a color film substrate comprising a black matrix, wherein a projection of the common electrode line in the direction perpendicular to the display panel is overlapped with a projection of the black matrix in the direction perpendicular to the display panel.

11. A display device comprising the display panel according to claim 1.

12. A display device comprising the display panel according to claim 10.

* * * * *